United States Patent [19]

Tanaka et al.

[11] Patent Number: 5,236,894

[45] Date of Patent: Aug. 17, 1993

[54] PROCESS FOR PRODUCING A SUPERCONDUCTING THIN FILM AT RELATIVELY LOW TEMPERATURE

[75] Inventors: Saburo Tanaka; Hideo Itozaki; Kenjiro Higaki; Shuji Yazu; Tetsuji Jodai, all of Itami, Japan

[73] Assignee: Sumitomo Electric Industries, Ltd., Japan

[21] Appl. No.: 950,922

[22] Filed: Sep. 24, 1992

Related U.S. Application Data

[63] Continuation of Ser. No. 290,310, Dec. 27, 1988, abandoned.

[30] Foreign Application Priority Data

Dec. 26, 1987 [JP] Japan .................................. 62-331202

[51] Int. Cl.$^5$ ...................... H01L 39/24; C23C 14/34; C23C 14/35
[52] U.S. Cl. .................................. 505/1; 204/192.24; 505/731; 505/816
[58] Field of Search ............... 204/192.24; 505/1, 731, 505/816

[56] References Cited

U.S. PATENT DOCUMENTS 4,912,087  3/1990  Aslam et al. ............................ 505/1

OTHER PUBLICATIONS

B. Y. Jin et al, *Advanced Ceramic Materials*, vol. 2, No. 3B, Special Issue (1987), pp. 436-443.
R. P. Bomer et al, *Vacuum*, vol. 20, No. 7, pp. 285-290 (1970).

*Primary Examiner*—Aaron Weisstuch
*Attorney, Agent, or Firm*—Bierman and Muserlian

[57] ABSTRACT

A process for depositing a superconducting thin film composed mainly of compound oxide such as $LnBa_2Cu_3O_{7-\delta}$ (Ln is lanthanide) or $(La_{1-x}\alpha_x)_2CuO_4$ ($\alpha$ is Ba or Sr) on a substrate such as MgO, $SrTiO_3$ or silicon by sputtering technique, characterized in that a negative bias is applied to the substrate during the sputtering stage without heating the substrate.

10 Claims, No Drawings

PROCESS FOR PRODUCING A SUPERCONDUCTING THIN FILM AT RELATIVELY LOW TEMPERATURE

PRIOR APPLICATION

This application is a continuation of U.S. patent application Ser. No. 290,310 filed Dec. 27, 1988, now abandoned.

BACKGROUND OF THE INVENTION

1. Field of the Invention

The present invention relates to an improvement in a process for producing a superconducting thin film; more particularly, it relates to a process for producing a superconducting thin film at relatively lower temperature without heating a substrate on which the thin film is deposited.

The process according to the present invention is useful to produce a superconducting thin film having a high critical temperature and a uniform composition on such a substrate that is sensitive to heat.

2. Description of the related art

Superconductivity is a phenomenon which is explained as a kind of phase change of electrons under which the electric resistance becomes zero and perfect diamagnetism is observed.

In the field of electronics, a variety of superconducting devices are known. A typical application of a superconducting device is the Josephson device in which quantum efficiency is observed macroscopically when an electric current is passed through a weak junction arranged between two superconductors. The tunnel junction type Josephson device is expected to be a high-speed and low-power, consuming switching device owing to smaller energy gap of the superconducting material. It is also expected to utilize the Josephson device as a highly sensitive sensor or detector for sensing very weak magnetic fields, microwaves, radiant rays or the like, since variation of electromagnetic waves or magnetic fields is reflected in a variation of the Josephson effect and can be observed as a precise quantum phenomenon. Development of superconducting devices such as high-speed logic units or no powerloss wiring materials is also demanded in the field of high-speed computers in which the power consumption per unit area is reaching the upper limit of cooling capacity with increase of the integration density in order to reduce energy consumption. However, the critical temperature "Tc" of superconductivity did not exceed 23.2 K of $Nb_3Ge$, which was the highest Tc for the past ten years.

The possibility of existence of a new type of superconducting material having much higher Tc was revealed by Bednorz and Müller, who discovered a new oxide type superconductor in 1986 [Z. Phys. B64 (1986) 180].

The new type compound oxide superconductor discovered by Bednorz and Müller is represented by $[La,Sr]_2CuO_4$ which is called a $K_2NiF_4$-type oxide having a crystal structure which is similar to known perovskite type oxides. The $K_2NiF_4$-type compound oxides show higher Tc's such as 30 K, which are extremely higher than known superconducting materials.

It was also reported in February 1987 that C. W. Chu et al. discovered, in the United States of America, another superconducting material of so called YBCO type represented by $YBa_2Cu_3O_{7-x}$ having a critical temperature of about 90 K. And hence, the possibility of existence of high-temperature superconductors has burst onto the scene.

The superconductor properties of the above-mentioned new type compound oxide superconductors are influenced by the oxygen deficiency in the crystal. In fact, if the oxygen deficiency does not exist in the crystal, high Tc cannot be observed and the difference between the on-set temperature and the temperature where perfect zero resistance is observed becomes large.

Thin films composed of the above-mentioned new type superconducting materials can be prepared by sputtering techniques, for example, RF magnetron sputtering or low pressure sputtering in which a sintered block composed of a superconducting compound oxide is used as a target. For example, a powdered material mixture comprising $Y_2O_3$, $BaCO_3$ and $CuO$ is sintered to obtain a sintered block of $Y_1Ba_2Cu_3O_7$ which is used as a target.

The conventional sputtering technique for preparing a thin film composed of the ceramics type oxide superconductors is disclosed in Japanese patent laid-open No. 56-109824. This patent teaches that the superconducting thin film which is represented by the formula $BaPb_{1-x}Bi_xO_3$ (in which $0.05 \leq x \leq 0.35$) is prepared by a high-frequency sputtering technique which is effected in an oxygen-containing atmosphere.

In the conventional sputtering technique, however, the substrate must be heated above 600° C. during the sputtering stage. In fact, if the substrate is not heated above 600° C., the thin film deposited on the substrate does not show desired superconducting properties because of poor crystallization of the compound oxide. In other words, heating of the substrate is indispensable in the conventional sputtering method. However, such a sputtering method is not applicable to a substrate that has a large difference in thermal expansion coefficient from that of the superconducting thin film. It is also impossible to use a heat-sensitive substrate whose properties are degraded at high temperatures. For example, it is difficult to use a single crystal of semiconductor material as a substrate because metal components in the compound oxide of which the superconducting thin film is composed diffuse into the single crystal, so that the properties of the thin film and the single crystal are changed. This means that the conventional process cannot be used in such combinations of superconducting compound oxide and semiconductor substrate which are very important for application of the superconducting compound oxides to the fabrication of superconducting transistors or the like.

The present applicants already proposed several processes for preparing the thin films of the high-Tc superconductor in the following patent applications: U.S. patent application Ser. No. 152,714 filed on Feb. 2, 1988, U.S. patent application Ser. No. 167,895 filed on Mar. 13, 1988, U.S. patent application Ser. No. 195,145 filed on May 12, 1988, now U.S. Pat. No. 5,900,716, U.S. patent application Ser. No. 195,147 filed on May 18, 1988, U.S. patent application Ser. No. 200,206 filed on May 31, 1988, now U.S. Pat. No. 4,996,185 or the like. Although the processes disclosed in these patent applications are themselves useful and satisfactory, it is still desirable to lower the substrate temperature during deposition of the thin film of superconductor.

Therefore, an object of the present invention is to provide a process which can be effected at a relatively lower temperature without heating the substrate and which is applicable for substrates composed of a single crystal of semiconductor material.

SUMMARY OF THE INVENTION

The present invention provides a process for depositing a superconducting thin film composed a compound oxide on a substrate by a sputtering technique, characterized by biasing said substrate to a negative voltage during the sputtering stage without heating the substrate.

According to a preferred embodiment of the present invention, the sputtering operation is carried out by RF magnetron sputtering.

According to the present invention, the substrate is biased negatively, so that activated atoms and/or ions sputtered out of a target arrive at a surface of the substrate in high energy levels and deposit on the surface to form a thin film having a good crystalline orientation even at a relatively lower substrate temperature. The voltage of the negative biasing is preferably selected in the range of 1 to 500 V.

Even in the process according to the present invention, the substrate temperature may rise to a certain level, for example 200° C. to 300° C. But the substrate temperature is not elevated higher than about 300° C. In the process according to the present invention, the substrate temperature is preferably maintained lower than 300° C.

By the process of the present invention, it becomes possible to use such materials which have not been usable in the past as a substrate material because of large differences in thermal expansion coefficient between the superconducting compound oxide and the substrate and because of a problem of deterioration of the substrate as described above.

The other sputtering conditions except the biasing condition can be selected according to standard operating parameters which are well-known in the art.

In the physical vapor deposition technique, the atomic ratio of metal elements contained in a vapor source is adjusted according to difference in the evaporation rate as well as difference in the deposition possibility of metal elements to be sputtered. The target is preferably composed of a sintered mass which is prepared by sintering of a powdered material mixture comprising metal elements and/or their oxides or carbonates and whose atomic ratio of the metal elements is adjusted according to the respective vaporization rates of the metal elements, or is composed of a sintered powder which is obtained by pulverizing the sintered mass. The target also can consist of powders of the constituent metal elements, oxides or carbonates. For example, when a thin film of $Y_1Ba_2Cu_3O_{7-\delta}$ is prepared, the target can be a single sintered mass which is produced by sintering a powder mixture of $Y_2O_3$, CuO and $BaCO_3$, or two target segments consisting of $Y_2O_3$ and $BaCuO_2$ or can be these powders themselves. In either case, the composition of the deposited thin film can be varied in a wide range by adjusting the composition of the target and/or by selecting a suitable combination of target segments.

The sputtering is preferably carried out in an oxygen-containing atmosphere whose oxygen partial pressure is selected in the range of $1.0 \times 10^{-8}$ to $5.0 \times 10^{-2}$ Torr. If the oxygen partial pressure is less than $1.0 \times 10^{-8}$ Torr, the oxygen content in the crystal of the superconducting thin film becomes too low, and to the contrary, if the oxygen partial pressure is higher than $5.0 \times 10^{-2}$ Torr, the satisfactory oxygen deficiency cannot be realized in the obtained thin film.

The substrate on which the superconducting thin film is deposited is preferably made of ceramics such as MgO, $SrTiO_3$, $ZrO_2$, YSZ, $Al_2O_3$, or the like, and more preferably, MgO or $SrTiO_3$.

The superconducting thin films of the above-mentioned compound oxide type show anisotropy in the critical current density. Namely, the current passing along a direction which is in parallel to a plane defined by the a-axis and b-axis of the crystal shows a very high critical current density, while the current passing along the other directions is relatively low. Therefore, in order to match the crystalline orientation of the superconducting thin film with that of the substrate, it is preferable to deposit the superconducting thin film on a specified plane of a single crystal such as MgO, $SrTiO_3$, YSZ, $ZrO_2$ or the like whose lattice spacing is nearly same that of the compound oxide crystal. It is preferable to deposit the superconducting thin film on the {001} plane of a single crystal of MgO or $SrTiO_3$. It is also possible to use the {110} plane. In this case, the c-axis is parallel with a surface of the substrate, so that current flows perpendicularly with respect to the c-axis in practical use. Still further, since the thermal expansion coefficient of MgO or $SrTiO_3$ is similar to that of the superconductor of compound oxide, the thin film is not subjected to undesirable stress caused by differences in the thermal expansion coefficient which will be exerted during the heating and cooling stages.

In the present invention, it is also possible to use a substrate of single crystal silicon because the sputtering can be carried out at relatively low temperature. The substrate may be glass or even stainless steel.

The superconducting thin film layer which can be used in the present invention may be any one of compound oxide type superconducting materials.

According to a preferred embodiment of the present invention, the superconducting thin film layer is composed of a compound oxide of at least one element α selected from Group IIa of the Periodic Table, at least one element β selected from Group IIIa of the Periodic Table and at least one element γ selected from a group comprising Groups Ib, IIb, IIIa, IVb and VIIIb of the Periodic Table.

One example of this type of compound oxide is represented by the general formula:

$$(La_{1-x}\alpha_x)_2CuO_4$$

in which α stands for Ba or Sr and $0.01 \leq x \leq 0.2$.

Another example of the above-mentioned compound oxide is the so called YBCO type compound oxide represented by the general formula:

$$Ln_1Ba_2Cu_3O_{7-\delta}$$

in which Ln stands for at least one lanthanide element selected from a group comprising La, Nd, Sm, Eu, Gd, Dy, Ho, Y, Er, Yb, Tm and Lu and δ is a number which satisfies a range of $0 \leq \delta < 1$. Namely this type compound oxide includes the following systems:

$$Y_1Ba_2Cu_3O_{7-\delta}, \quad Ho_1Ba_2Cu_3O_{7-\delta}, \quad Lu_1Ba_2Cu_3O_{7-\delta},$$

$Sm_1Ba_2Cu_3O_{7-\delta}$, $Nd_1Ba_2Cu_3O_{7-\delta}$, $Gd_1Ba_2Cu_3O_{7-\delta}$, $Eu_1Ba_2Cu_3O_{7-\delta}$, $Er_1Ba_2Cu_3O_{7-\delta}$, $Dy_1Ba_2Cu_3O_{7-\delta}$, $Tm_1Ba_2Cu_3O_{7-\delta}$, $Yb_1Ba_2Cu_3O_{7-\delta}$, $La_1Ba_2Cu_3O_{7-\delta}$ in which $\delta$ is a number which satisfies the range of $0<\delta<1$ and preferably possesses perovskite type or quasi-perovskite type crystal structure. The term quasi-perovskite type means a structure which can be considered to be similar to perovskite-type oxides and includes an orthorhombically distorted perovskite or a distorted oxygen-deficient perovskite or the like.

Still another example of the above-mentioned compound oxide is compound oxides represented by the general formula:

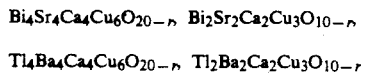

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0<q<1$, and r is a number which satisfies a range of $-2 \leq r \leq +2$. Namely, this type of compound oxide includes the following systems:

$Bi_4Sr_4Ca_4Cu_6O_{20-r}$, $Bi_2Sr_2Ca_2Cu_3O_{10-r}$, $Tl_4Ba_4Ca_4Cu_6O_{20-r}$, $Tl_2Ba_2Ca_2Cu_3O_{10-r}$ in which r is a number which satisfies a range of $-2 \leq r \leq +2$.

Now, we will describe examples of the present invention, but the scope of the present invention should not be limited thereto.

EXAMPLE 1

A superconducting thin film $Ho_1Ba_2Cu_3O_{7-\delta}$ is deposited on the {001} plane of a single crystal MgO substrate by an RF magnetron sputtering technique according to the present invention. The target used in this Example is a sintered ceramic target prepared by sintering a powdered material mixture whose atomic ratio of Ho:Ba:Cu is adjusted to 1:2:4.

After the chamber is evacuated, argon gas of $5.0 \times 10^{-2}$ Torr and oxygen gas of $1.0 \times 10^{-2}$ Torr pressure are introduced. Then, sputtering is carried out at a high-frequency power of 3 W/cm$^2$ at a deposition rate of about 0.50 Å/sec until the compound oxide is deposited to a thickness of 1 μm.

In this example, the substrate of MgO single crystal is biased to $-100$ V during the sputtering operation.

The superconducting properties of the deposited thin film are shown in Table 1.

EXAMPLE 2

The same superconducting thin film as Example 1 is deposited on an silicon single crystal substrate.

The atmosphere in a sputtering chamber is changed to argon gas pressure of $6.0 \times 10^{-2}$ Torr and oxygen gas pressure of $5.0 \times 10^{-3}$ Torr so that the silicon substrate is not deteriorated by the oxygen.

Sputtering is carried out at a high-frequency power of 2 W/cm$^2$ at a deposition rate of about 0.20 Å/sec until the compound oxide is deposited to a thickness of 1 μm.

In this example, the substrate of silicon single crystal is biased to $-150$ V during the sputtering operation.

The superconducting properties of the resulting deposited thin film are shown in Table 1.

EXAMPLE 3

A superconducting thin film of $Bi_2Sr_2Ca_2Cu_3O_x$ is deposited on the {001} plane of a single crystal MgO substrate by an RF magnetron sputtering technique according to the present invention. The target used in this Example is a sintered ceramic target prepared by sintering a powdered material mixture whose atomic ratio of Bi:Sr:Ca:cu is adjusted to 1.4:1:1:1.5.

After the chamber is evacuated, argon gas of $1.6 \times 10^{-2}$ Torr and oxygen gas of $4.0 \times 10^{-3}$ Torr pressure are introduced. Then, sputtering is carried out at a RF high-frequency power of 0.6 W/cm$^2$ at a deposition rate of about 0.5 Å/sec until the compound oxide is deposited to a thickness of 1 μm.

In this example, the substrate of MgO single crystal is biased to $-100$ V during the sputtering operation.

The superconducting properties of the deposited thin film are shown in Table 1.

COMPARATIVE EXAMPLE 1

Example 1 is repeated except that no bias voltage is applied to the substrate of MgO single crystal.

In this comparative example, the deposited oxide does not form a thin film because the substrate is not heated and hence no superconducting property is observed in the resulting deposited compound oxide.

COMPARATIVE EXAMPLE 2

Example 1 is repeated except that no bias voltage is applied to the substrate or MgO single crystal. In this comparative example, the substrate of MgO single crystal is heated at 730° C. during the sputtering stage and, when the sputtering is completed, the substrate is cooled slowly at a cooling rate of 7° C./min. Sputtering is carried out at a deposition rate of about 0.6 Å/sec until a thin film of 1 μm is obtained. The superconducting properties of the resulting deposited thin film are shown in

COMPARATIVE EXAMPLE 3

Example 3 is repeated except that no bias voltage is applied to the substrate of MgO single crystal.

In this comparative example, the deposited oxide does not form a thin film because the substrate is not heated, so that no superconducting property is shown.

TABLE 1

| | Critical temperature (K) | | Critical current density |
| --- | --- | --- | --- |
| | on-set | zero resistance | Jc (A/cm$^2$) |
| Example | | | |
| 1 | 98 | 94 | $3 \times 10^5$ |
| 2 | 96 | 92 | $1.5 \times 10^5$ |
| 3 | 120 | 105 | $5 \times 10^5$ |
| Comparative | | | |
| 1 | —(*) | —(*) | —(*) |
| 2 | 92 | 85 | $3 \times 10^5$ |
| 3 | —(*) | —(*) | —(*) |

Note: (*) deposition of poor quality

We claim:

1. A process for the deposition of a superconductive compound oxide film on a single crystal substrate of silicon, comprising RF sputtering said oxide in the presence of oxygen containing gas, and biasing said substrate at a negative voltage of 100 to 500 V during said sputtering without heating said substrate.

2. A process set forth in claim 1 characterized in that said superconducting thin film layer is composed of a compound oxide of at least one element selected from IIA group of the Periodic Table, at least one element selected from IIIB group of the Periodic Table, and at least one element selected from a group consisting of Groups IB, IIB, IIIA, IVB, and VIIIB of the Periodic Table.

3. The process of claim 1 wherein said gas is a mixture of $O_2$ and Ar.

4. The process of claim 1 wherein said oxygen has a partial pressure of $1.0 \times 10^{-8}$ to $5.0 \times 10^{-2}$ torr.

5. The process of claim 1 wherein said sputtering is RF magnetron sputtering.

6. The process of claim 1 wherein said substrate is at a temperature of less than 300° C. during said sputtering.

7. The process of claim 1 wherein said superconducting film is composed mainly of said compound oxide of the general formula:

$$Ln_1Ba_2Cu_3O_{7-\delta}$$

in which Ln stands for at least one lanthanide element selected from the group consisting of La, Nd, Sm, Eu, Gd, Dy, Ho, Y, Er, Yb, Tm, and Lu, and $\delta$ is from 0 to 1.

8. The process of claim 7 wherein Ln is an element selected from the group consisting of Y, Er, Ho, and Dy.

9. The process of claim 1 wherein said superconducting film is composed mainly of said compound oxide of the general formula:

$$(La_{1-x}\alpha_x)_2CuO_4$$

in which $\alpha$ stands for Ba or Sr and x is 0.01 to 0.2.

10. The process of claim 1 wherein said superconducting film is composed mainly of said compound oxide of the general formula:

$$\Theta_4(\phi_{1-q}, Ca_q)_m Cu_nO_{p+r}$$

in which $\theta$ stands for Bi or Tl, $\phi$ stands for Sr when $\theta$ is Bi and stands for Ba when $\theta$ is Tl, m and n are 6 to 10 and 4 to 8, respectively, $p=(6+m+n)$, q us 0 to 1, and r is $-2$ to $+2$.

* * * * *